United States Patent
Nakamura

(10) Patent No.: US 6,810,299 B2
(45) Date of Patent: Oct. 26, 2004

(54) SEMICONDUCTOR MANUFACTURING APPARATUS

(75) Inventor: Gen Nakamura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 145 days.

(21) Appl. No.: 10/044,937

(22) Filed: Jan. 15, 2002

(65) Prior Publication Data

US 2002/0097205 A1 Jul. 25, 2002

(30) Foreign Application Priority Data

Jan. 23, 2001 (JP) ........................................ 2001-014209

(51) Int. Cl.[7] .......................... G06F 19/00; G05D 23/00; H01K 1/58
(52) U.S. Cl. ........................... 700/121; 700/300; 313/13
(58) Field of Search ................................ 700/121, 300; 313/13

(56) References Cited

U.S. PATENT DOCUMENTS

| | | | | |
|---|---|---|---|---|
| 4,495,780 A | * | 1/1985 | Kaneko et al. ............... | 62/229 |
| 5,700,084 A | * | 12/1997 | Yasukawa et al. ........... | 362/275 |
| 5,726,739 A | * | 3/1998 | Hayata ......................... | 355/67 |
| 5,971,577 A | * | 10/1999 | Mori et al. .................. | 362/575 |
| 6,040,894 A | * | 3/2000 | Takahashi ..................... | 355/53 |
| 6,064,468 A | * | 5/2000 | Sakaguchi .................... | 355/67 |
| 6,104,204 A | * | 8/2000 | Hayama et al. ............. | 324/760 |
| 6,247,830 B1 | * | 6/2001 | Winnett et al. .............. | 362/264 |
| 6,295,121 B1 | | 9/2001 | Nakamura .................... | 355/67 |
| 6,333,602 B1 | * | 12/2001 | Kayser ....................... | 315/117 |
| 6,337,732 B2 | | 1/2002 | Nakamura .................... | 355/30 |
| 2001/0047213 A1 | * | 11/2001 | Sepe .......................... | 700/65 |

* cited by examiner

*Primary Examiner*—Albert W. Paladini
*Assistant Examiner*—Elliot L Frank
(74) *Attorney, Agent, or Firm*—Fitzpatrick, Cella, Harper & Scinto

(57) ABSTRACT

A semiconductor manufacturing apparatus includes a light source and a lighting device that lights the light the light source A connector connects the light source and the lighting device with a metal piece to provide control of generation of noise accompanying increased electrical power supplied to the lamp and control of the space required for installation in a single housing having outer walls with electromagnetic shielding. Temperature of the light source and the lighting device is adjusted using air of the ambient atmosphere from outside the housing.

25 Claims, 11 Drawing Sheets

URL  http://www.maintain.co.jp/db/input.html

TROUBLE DATABASE INPUT SCREEN

DATA OF OCCURRENCE  2000/3/15  — 404
MODEL  * * * * * * * * *  — 401
TITLE  OPERATIONAL MALFUNCTION (STARTUP ERROR)  — 403
EQUIPMENT SERIAL NO.  465NS4580001  — 402
URGENCY  D  — 405
SYMPTOMS  LED CONTINUES TO BLINK AFTER TURNING POWER ON  — 406

MEASURES  TURN ON POWER AGAIN (PRESS RED BUTTON AT STARTUP)  — 407

RESULTS  TENTATIVELY HANDLED  — 408

[SEND] [RESET]

410 — LINK TO DATABASE OF LIST OF RESULTS
411 — SOFTWARE LIBRARY
412 — OPERATING GUIDE

FLOW FOR MANUFACTURING SEMICONDUCTOR DEVICES

WAFER PROCESS

SEMICONDUCTOR MANUFACTURING APPARATUS

BACKGROUND OF THE INVENTION

1. Field of the Invention

The present invention relates to a semiconductor manufacturing apparatus for manufacturing semiconductor devices or the like, and particularly, relates to a lighting device for an exposure device for performing photo-exposure.

2. Description of the Related Art

In recent years, semiconductor devices have become more minute, and accordingly, environments capable of even more minute working are necessary, with regard to semiconductor manufacturing apparatuses such as exposure devices and the like for manufacturing semiconductor devices and the like. Also, there is a need for improvement in the productivity and manufacturing efficiency of semiconductor manufacturing apparatuses.

As such, high-output light source devices are used for improving the productivity and manufacturing efficiency of semiconductor manufacturing apparatuses, thereby manufacturing and fabricating semiconductor devices with short exposure times.

With conventional exposure devices serving as the semiconductor manufacturing devices, exposure light emitted from the light source thereof is shielded or projected using a shielding device called a shutter, thereby controlling the amount of exposure light to a level appropriate for manufacturing the semiconductor devices and exposing a wafer via a reticle and lens. Normally, the light source for emitting the exposure light has been changed to one that emits a great amount of light, to reduce the amount of time of exposure for obtaining the proper amount of exposure light, thereby increasing the number of wafers processed per unit time, so as to increase productivity and increase the manufacturing efficiency of the exposure apparatus itself.

In this case, the exposure lamp, which is a light source having near-ultraviolet light-emitting properties, so that the amount of electrical power supplied to the exposure lamp is great, has changed from around 1 kW to several kW. Generally, lamps used as light sources for exposure apparatuses are lamps using discharge. A lighting device for lighting the lamp has a part called a starter unit connected thereto for starting the lighting, i.e., the discharge, so as to perform a lighting operation of generating high voltage for starting discharge at the time of the lighting. Also, following starting of the lighting and discharge, a current is constantly applied, thereby maintaining the state of discharge and lighting.

The starter unit generates noise, which affects the exposure apparatus due to the high voltage at the time of starting the lighting and discharge, and there has arisen a concern that this might cause malfunctioning of the exposure apparatus, damage to the electronic parts of the exposure apparatus, and so forth. Generally speaking, there are normally three types of noise caused by generation of high voltage for lighting and discharge: that generated from the lighting device itself including the starter unit, that generated from cables connecting the lighting device and the lamp, and that generated from the lamp itself.

In recent years, the amount of electrical power supplied to the exposure lamp has increased, and accordingly, the high voltage at the time of starting the lighting and the current constantly flowing are both greater, so the noise generated also increases.

First, with regard to the noise generated from the lighting device itself, the entire lighting device is enclosed in a metal housing, so no noise leaking out from the lighting device can be kept to a level not greater than that with conventional arrangements by means of grounding the housing or so forth, even with greater levels of noise being generated.

Second, with regard to the noise generated from the cables connecting the lamp with the lighting device, the increased electrical power being supplied to the lamp means that the current flowing through the cables is also greater, so the cables must be upgraded to cables one or two steps heavier. Further shielding the heavier cables results in even bulkier cables and creates a problem of increased space that is required for the bulkier cables.

Third, with regard to the noise generated from the lamp itself, the lamp house unit where the lamp is disposed is also contained in a metal housing similar to that of the lighting device, so noise leaking out from the lamp box can be kept to a level not greater than that with conventional arrangements by means of grounding the housing and so forth, even with greater levels of noise being generated, as with the case of the lighting device. Also, an increase in the size of the lamp results in increased heat generated from the lamp itself and increased heat generated from the electrical power source unit within the lighting device, meaning the cooling devices for cooling these elements must be disposed at various locations, so the increased cooling devices and increased space required for the increased cooling devices have become problematic as well.

SUMMARY OF THE INVENTION

The present invention has been made in light of the above problems, and accordingly, it is an object thereof to provide a semiconductor manufacturing apparatus whereby generation of noise accompanying increased electrical power supplied to the lamp is maintained at a level equal to or less than that of conventional arrangements, and the space required for installing increasingly larger semiconductor manufacturing apparatuses is maintained at a scale equal to or smaller than that of conventional arrangements, thereby lightening the overall task of installing the semiconductor manufacturing apparatus including the related cables.

It is another object of the present invention to provide a semiconductor manufacturing apparatus whereby the efficiency of the cooling device (temperature-adjusting device) is improved, and electrical power used for the cooling (temperature adjusting) is reduced, and thus conserved.

To this end, according to a first aspect of the present invention, a semiconductor manufacturing apparatus comprises a light source and a lighting device, the lighting device comprises an electrical power source unit for supplying electricity to the light source and a starter unit for lighting the light source, wherein the starter unit has a metal piece for connecting the lighting device to the light source.

Also, according to a second aspect of the present invention, a semiconductor manufacturing apparatus comprises: a light source; a lighting device for lighting the light source; and a connector for connecting the light source and the lighting device with a metal piece.

The light source may be a discharge lamp, the light source and the lighting device may be disposed within a single housing, and the housing may have outer walls provided with electromagnetic shielding and a configuration of copper wire mesh sandwiched between thermal insulating material, the copper wire mesh being grounded.

The metal piece may be disposed at a side wherein high voltage is applied for lighting the light source. Also, the semiconductor manufacturing apparatus may further have a mechanism for integrally driving the light source and the lighting device.

The semiconductor manufacturing apparatus may further comprise means for changing the positional relation between the light source and an optical element disposed near the light source.

Also, the temperature of the light source and the lighting device may be adjusted using air of the ambient atmosphere outside the housing, taken into the housing from a single air intake and subjected to temperature adjustment with a single temperature adjusting means.

The light source and the lighting device may be subjected to temperature adjustment in the order of the lighting device first and then the light source, using the taken in air.

The semiconductor manufacturing apparatus according to the second aspect may further comprise a computer having a display, a network interface, and networking software, wherein data communication of maintenance information regarding the semiconductor manufacturing apparatus can be performed via a computer network. Here, the networking software may provide, on the display, a user interface for accessing a maintenance database which is provided by a vendor or user of the semiconductor manufacturing apparatus and which is connected to an external network outside of a plant wherein the semiconductor manufacturing apparatus is installed, thereby enabling information to be obtained from the database via the external network.

According to another aspect of the present invention, a semiconductor device manufacturing method comprises a step of installing, in a semiconductor manufacturing plant, a set of manufacturing apparatuses for performing various processes, including the semiconductor manufacturing apparatus according to the second aspect of the present invention, and a step of manufacturing semiconductor devices by a plurality of processes using the set of manufacturing apparatuses.

The semiconductor device manufacturing method may further comprise a step of connecting the set of manufacturing apparatuses by a Local Area Network, and a step of performing data communication of information relating to at least one apparatus of the set of manufacturing apparatuses between the Local Area Network and the external network outside of the semiconductor manufacturing plant.

A database, which is provided by a vendor or user of the semiconductor manufacturing apparatus may be accessed via the external network and maintenance information for the manufacturing apparatus can be obtained by data communication, or data communication may be performed with a semiconductor manufacturing plant other than the semiconductor manufacturing plant, via the external network, so as to manage production.

According to another aspect of the present invention, a semiconductor manufacturing plant comprises: a set of manufacturing apparatuses for performing various processes, the set including the semiconductor manufacturing apparatus according to the second aspect of the invention; a Local Area Network connecting the set of manufacturing apparatuses; and a gateway enabling access to an external network outside of the plant from the Local Area Network, wherein data communication of information relating to at least one apparatus of the set of manufacturing apparatuses is performed.

According to another aspect of the present invention, a maintenance method for the semiconductor manufacturing apparatus according to the second aspect of the present invention installed in a semiconductor manufacturing plant comprises: a step of a vendor or user of the semiconductor manufacturing apparatus providing a maintenance database connected to an external network outside of the semiconductor manufacturing plant; a step of permitting access to the maintenance database from within the semiconductor manufacturing plant via the external network; and a step of transmitting maintenance information accumulated in the maintenance database to the semiconductor manufacturing plant side via the external network.

In the above configuration, the lighting device power source unit for lighting the light source lamp is disposed below the lamp box and the light source lamp, with the starter unit for lighting the lamp being disposed integrally with the lighting device above the power source unit. Also a connecting metal piece for connecting the light source lamp is provided for the starter unit itself, and electrical power is supplied from the lighting device electrical power source to the light source lamp using this metal piece. Also, this metal piece can be used as a lamp fixing metal piece for physically fixing the lamp. The positional relation of these components are, from the bottom, the lighting device electrical power source unit, above which is the starter unit, and above which is the light source lamp.

Also, the lighting device power source unit and the starter unit having the light source lamp connecting metal piece are built into the same metal housing, thereby omitting a cable connecting the starter unit and light source lamp, which existed in conventional arrangements. Also, with respect to the matter of heat generation, the light source lamp generates more heat than the lighting device power source unit, by several times. Accordingly, air which has cooled the outer walls of the lighting device power source unit can be used for cooling the lamp unit, and with the present invention, the lamp unit and the lighting device power source unit are formed integrally, so the air which has cooled the walls of the lighting device power source unit is not exhausted, but is sent to the lamp unit and used for cooling the lamp unit with the same cooling device, following which the hot exhaust is vented by a hot air vent.

This omitting of the cable due to direct connection to the light source lamp and using the same cooling device (cooler) means that generation of noise accompanying increased electrical power supplied to the lamp is maintained at a level equal to or less than that of conventional arrangements, and the space required for installing increasingly larger semiconductor manufacturing apparatuses is maintained at a scale equal to or smaller than that of conventional arrangements, thereby lightening the overall task of installing the semiconductor manufacturing apparatus including the cables, which achieves a first object of the present invention. Also, the efficiency of the cooling device (temperature-adjusting device) is improved, and electrical power used for the cooling (temperature adjusting) is reduced and thus conserved, which achieves a second object of the semiconductor manufacturing apparatus according to the present invention.

Further objects, features and advantages of the present invention will become apparent from the following description of the preferred embodiments with reference to the attached drawings.

BRIEF DESCRIPTION OF THE DRAWINGS

FIG. 10 is a diagram illustrating a specific example of a user interface in a semiconductor device manufacturing system including the semiconductor manufacturing apparatus according to the first embodiment of the present invention;

DESCRIPTION OF THE PREFERRED EMBODIMENTS

Next, a description will be made of preferred embodiments of the present invention, with reference to the drawings.

First Embodiment

Figure 1:
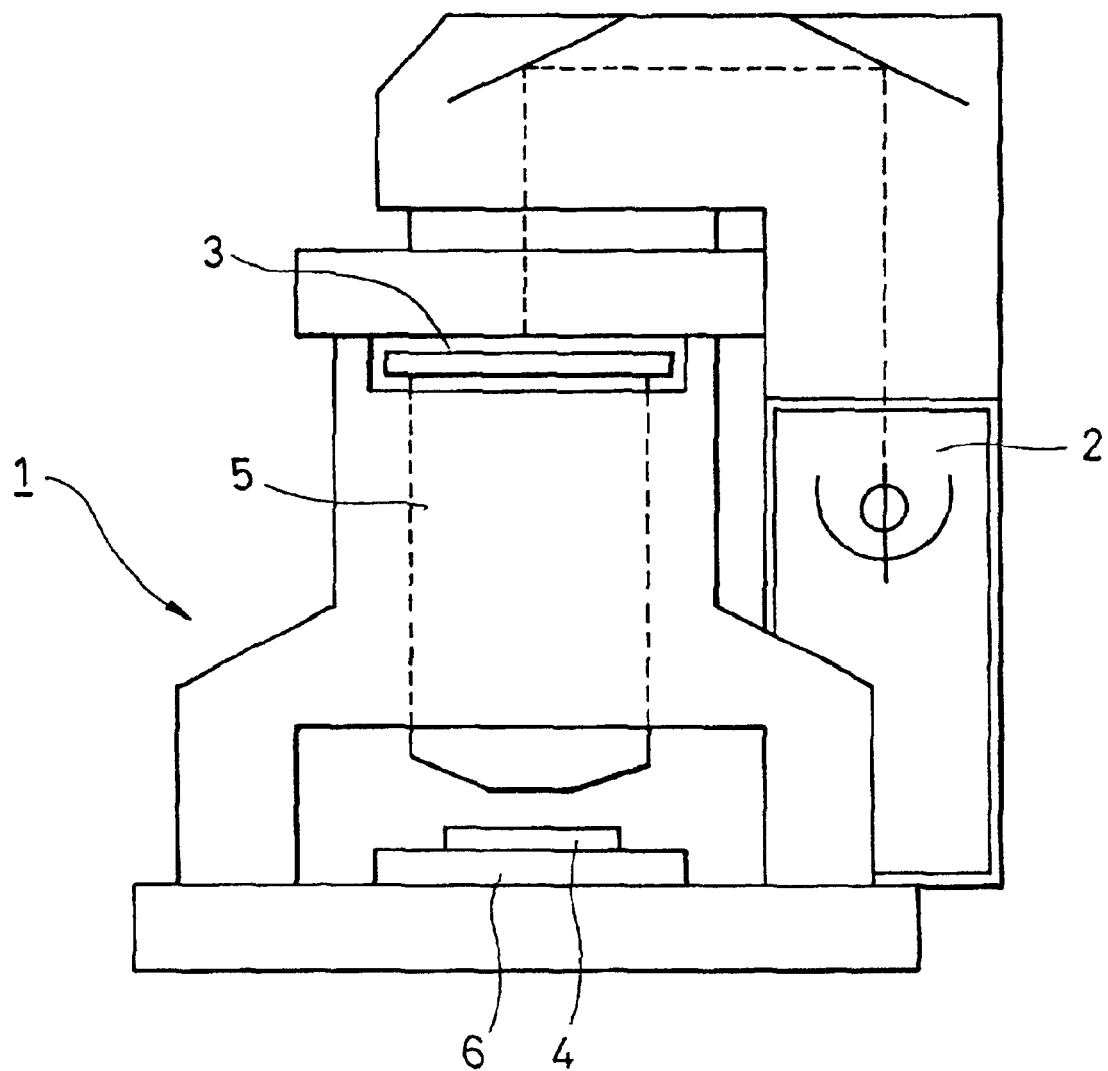
FIG. 1 is a schematic diagram of the principal components, illustrating an exposure device called a stepper, which is a semiconductor manufacturing apparatus according to a first embodiment of the present invention.

FIG. 1 is a schematic diagram of the principal components, illustrating an exposure device called a stepper, which is a semiconductor manufacturing apparatus according to a first embodiment of the present invention.

As shown in FIG. 1, the semiconductor manufacturing apparatus 1 has a lamp box 2 containing a light source for emitting light to image semiconductor patterns, a reticle 3 serving as an original plate for receiving semiconductor patterns, an exposure projection lens 5 for exposing the pattern on the reticle 3 onto a wafer 4, and an X-Y stage 6, which carries the wafer 4 and can move in the X and Y directions, wherein the semiconductor pattern on the reticle 3 is imaged onto the wafer 4 using light emitted from the lamp box 2 containing the light source.

Figure 2:
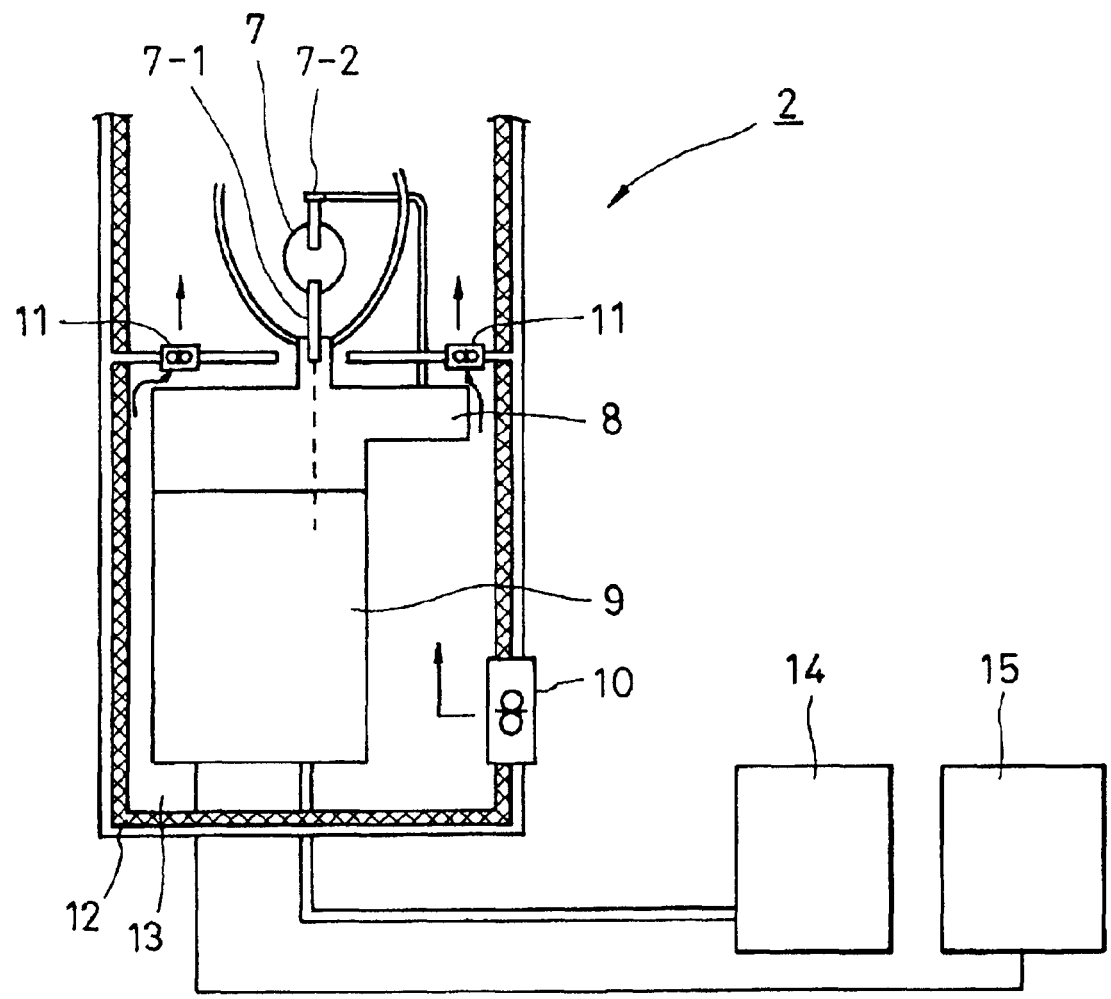
FIG. 2 is a diagram illustrating in more detail a lamp box 2 shown in FIG. 1.

FIG. 2 is a diagram illustrating in more detail the lamp box 2 shown in FIG. 1. In FIG. 2, reference numeral 7 denotes the light source lamp itself, 7-1 denotes the cathode of the light source lamp, and 7-2 denotes the anode of the light source lamp. Reference numeral 8 denotes a starter unit for lighting the light source lamp 7, and reference numeral 9 denotes a lighting device electrical power source unit. The starter unit 8 and the lighting device electrical power source unit 9 are formed integrally. Reference numeral 10 denotes a cooling device (temperature-adjusting device) for cooling the lighting device electrical power source unit 9, cooling the outer walls of the housing of the starter unit 8 and the lighting device electrical power source unit 9. The cooling air from the cooling device only cools the outer walls of the housing, and is sent to the light source lamp unit 7 without being contaminated by chemical substances within the lighting device electrical power source unit 9 or the starter unit 8. Reference numeral 11 denotes a lamp cooling device (temperature-adjusting device) for cooling the light source lamp unit 7. The lamp cooling device 11 has the function of sending the air which has cooled the outer walls of the housing of the lighting device electrical power source unit 9 and the starter unit 8 to the light source lamp 7. Also, a chemical filter is attached to the lamp cooling device 11 on the side of the lighting device electrical power source unit 9 and the starter unit 8, thereby removing organic material which causes clouding up of the lamp 7.

Reference numeral 12 denotes thermal insulation material, disposed so that the heat within the lamp box does not externally leak. Reference numeral 13 denotes a duct through which the cooling air passes, this cooling air cooling the lighting device electrical power source unit 9 and the starter unit 8 from the side faces of the lighting device electrical power source unit 9 and the starter unit 8. Reference numeral 14 denotes a main power source unit for supplying power to the semiconductor manufacturing apparatus, and specifically, for supplying commercial 200 V three-phase electricity to the lighting device electrical power source unit 9 in the present embodiment. Reference numeral 15 denotes a control unit for controlling the semiconductor manufacturing apparatus, for controlling the lighting and turning off of the light source lamp 7, and also for monitoring the lighting state of the light source lamp 7.

Figure 3:
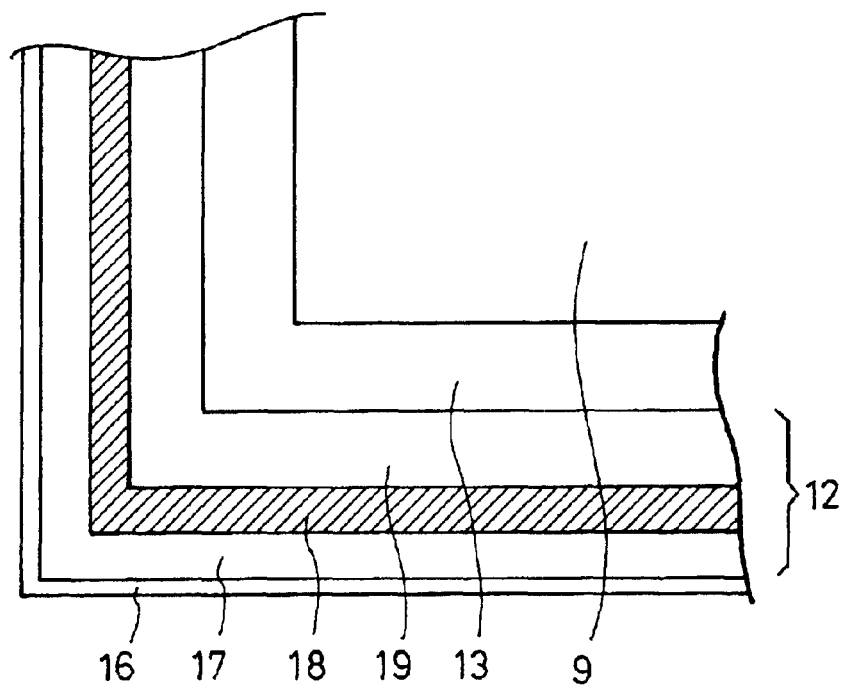
FIG. 3 is a diagram illustrating the structure of the outer wall of the lamp box 2 shown in FIG. 2.

FIG. 3 is a diagram illustrating the structure of the outer walls 12 of the lamp box 2 shown in FIG. 2. In FIG. 3, reference numerals which are the same as those in FIG. 2 denote the same components. In the FIG. 3, reference 16 denotes an outer cover of the lamp box, 17 and 19 denote thermal insulating material, and 18 denotes shielding copper wire mesh. The copper wire mesh 18 is sandwiched between the thermal insulating material 17 and 19.

Figure 4:
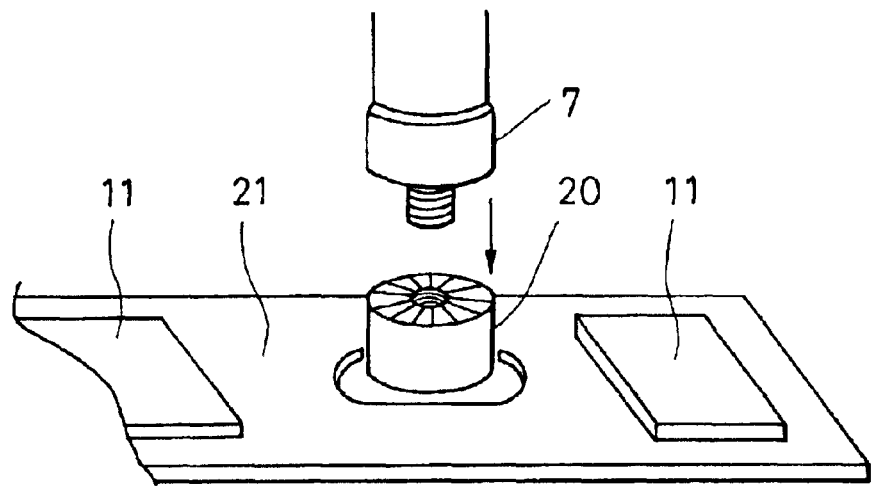
FIG. 4 is a diagram illustrating a connecting metal piece 20 for attaching a light source lamp 7 shown in FIG. 2.

FIG. 4 is a diagram illustrating a connecting metal piece 20 attached to the light source lamp 7 shown in FIG. 2. In FIG. 4, the connecting metal piece 20 is fixed to the starter unit 8 (not shown), and is disposed so as to pass through a partition 21 separating the starter unit 8 and the light source lamp 7. The vent of the lamp cooling device 11 is situated above the partition 21.

Figure 5:
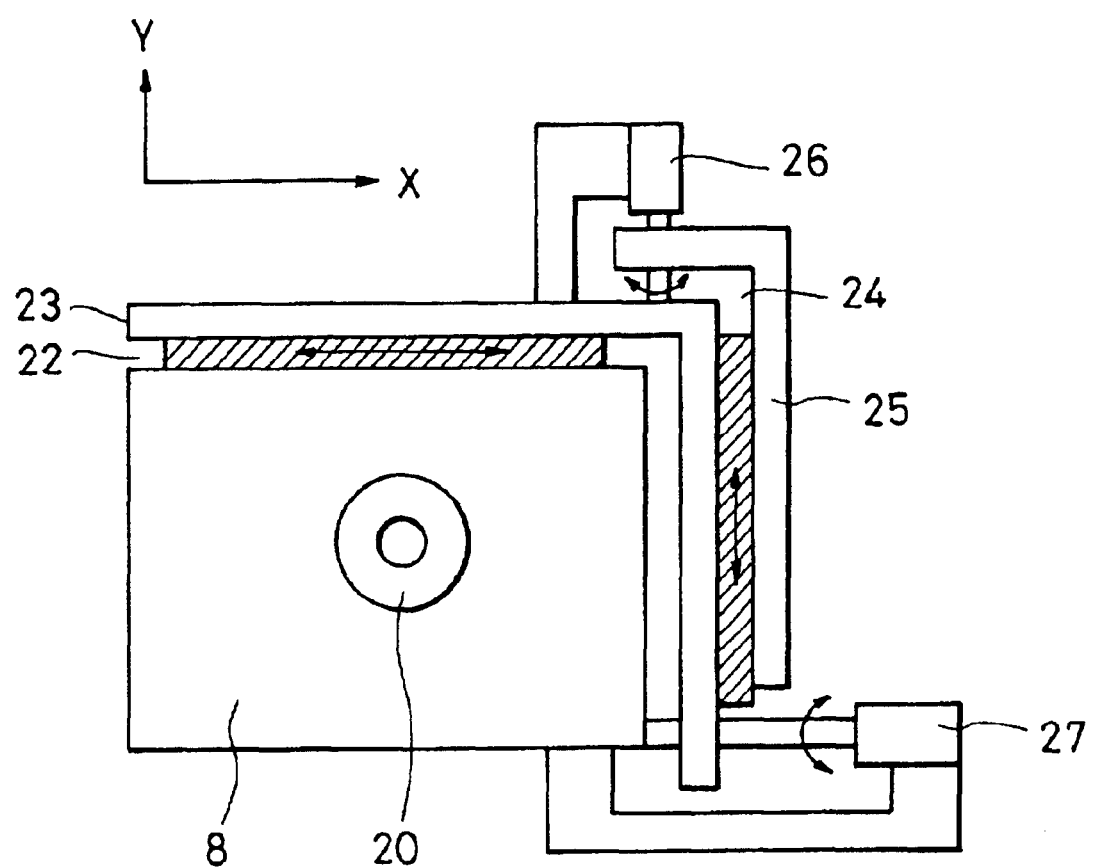
FIG. 5 is an X-Y plan view illustrating an X-Y driving mechanism for driving the light source lamp 7 shown in FIG. 2.

FIG. 5 is an X-Y plan view illustrating the X-Y driving mechanism of the light source lamp 7 shown in FIG. 2. Conventionally, only the connecting portion of the light source lamp 7 had been driven in the X and Y directions, but with the present embodiment, the starter unit 8 and the lighting device electrical power source unit 9 are driven together. The driving mechanism of the present embodiment has the same configuration as that of a conventional arrangement wherein only the connection portion is driven, so there are no complications from applying the present embodiment. Also, FIG. 5 omits the partition 21 (see FIG. 4) separating the starter unit 8 and the light source lamp 7 so that the driving mechanism portion can be viewed more readily. In FIG. 5, the starter unit 8 is connected to an X guide 22 capable of being driven in the X direction, and the X guide 22 is connected to a starter X driving unit 23. An X driving motor 27 for driving in the X direction is attached to the starter unit 8, performing X driving using a ball screw.

The starter X driving unit 23 is connected to a Y guide 24 capable of being driven in the Y direction, and the Y guide 24 is connected to a starter Y driving unit 25. A Y driving motor 26 for driving in the Y direction is attached to the starter X driving unit 23, performing Y driving using a ball screw, as with the case in the X direction.

Figure 6:
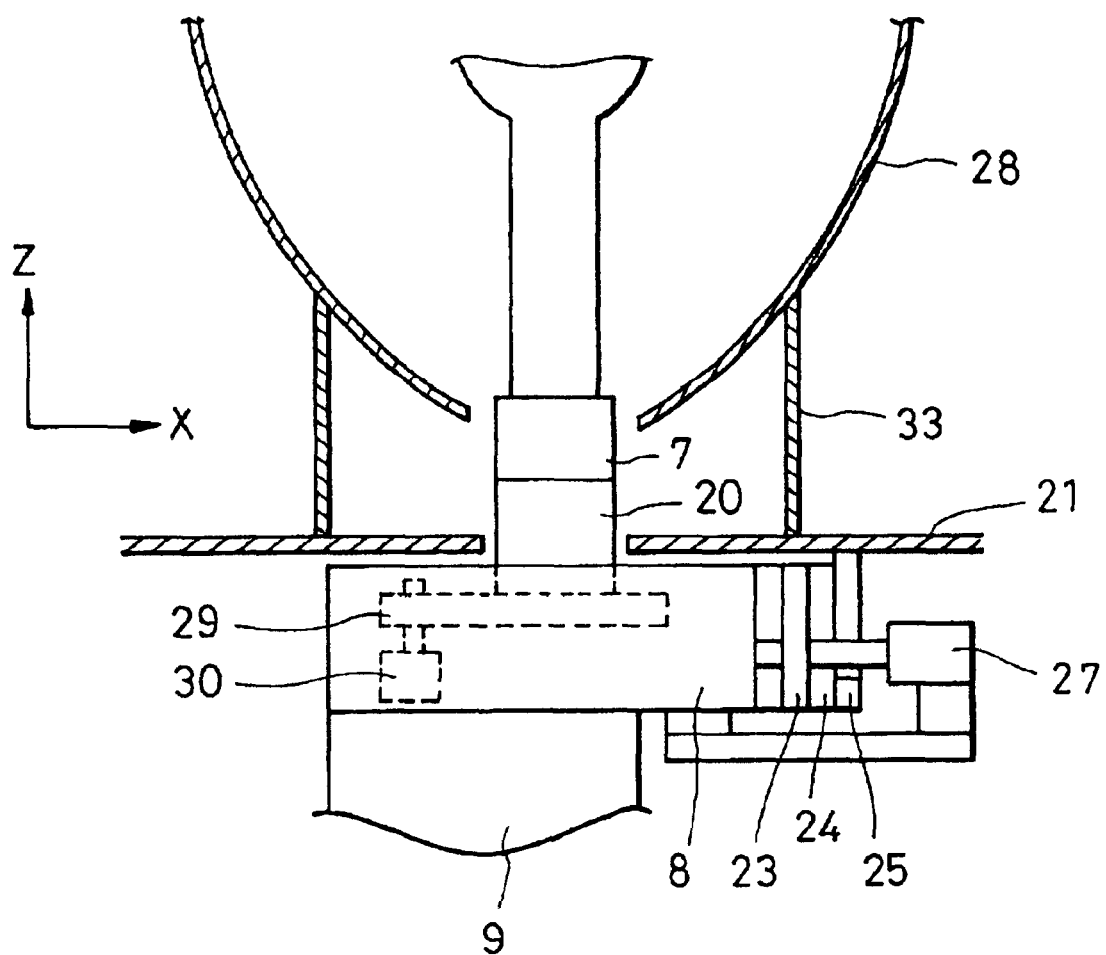
FIG. 6 is a cross-sectional view on an X-Z plane of the X-Y driving mechanism shown in FIG. 5.

FIG. 6 is a cross-sectional view on an X-Z plane of the X-Y driving mechanism shown in FIG. 5, and reference numerals which are the same as those in FIG. 5 denote the same components. In FIG. 6, the components are arranged in the order of, from the bottom, the lighting device electrical power source unit 9, starter unit 8, and partition 21, with an elliptical mirror 28 attached to the partition 21 by a mirror fixing metal piece 33. Also, attached beside the starter unit 8 are, of the X-Y driving mechanism, the starter X driving unit 23, Y guide 24, starter Y driving unit 25, and X driving motor 27, with the starter Y driving unit 25 being fixed to the partition 21.

A mechanism for driving only the lamp connecting metal piece 20 in the Z direction is built into the starter unit 8, and a lamp connecting metal piece fixing part 29 is driven in the Z direction by a Z driving motor 30.

Figure 7:
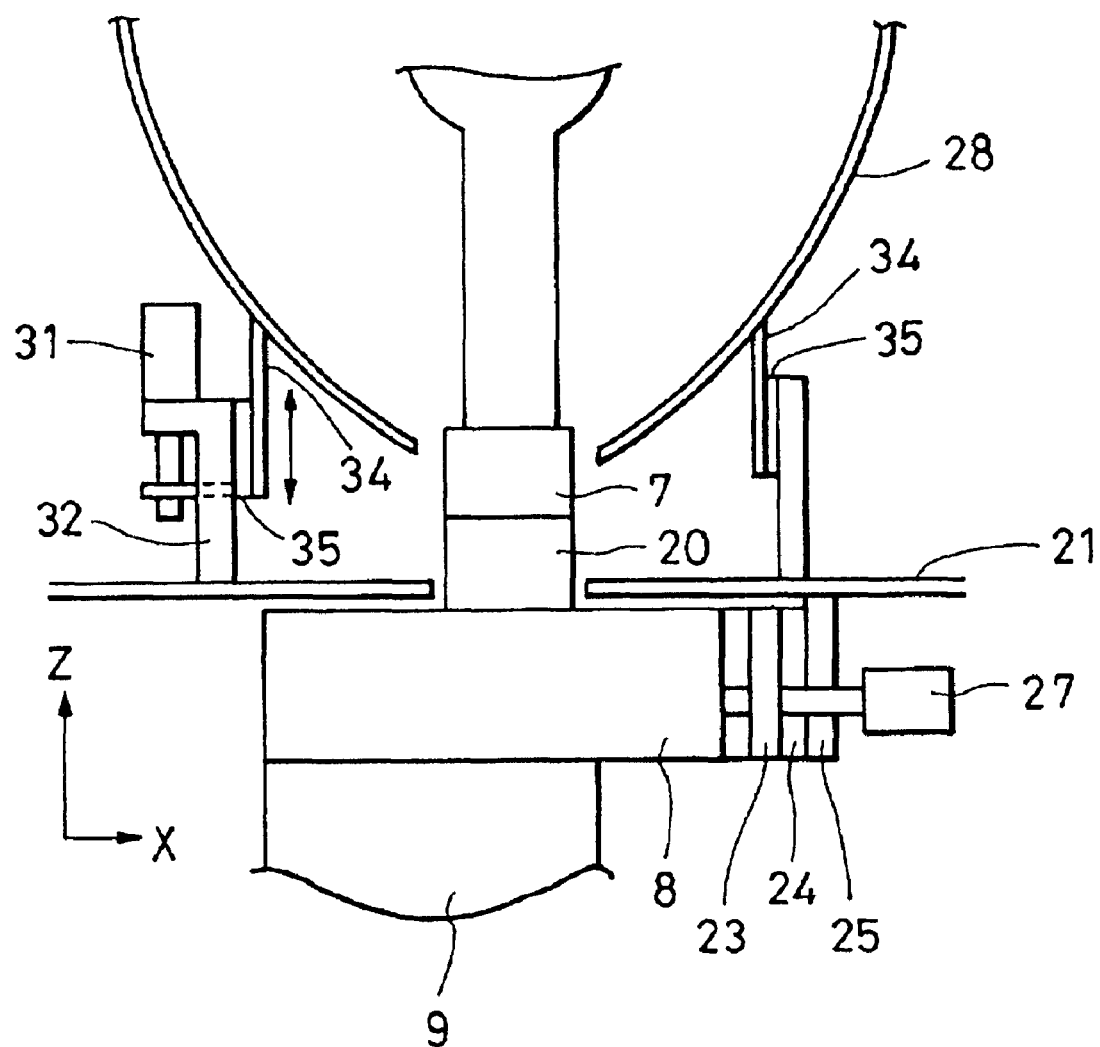
FIG. 7 is a diagram describing another embodiment of the Z driving mechanism shown in FIG. 6.

FIG. 7 is another embodiment of the Z driving mechanism shown in FIG. 6, and reference numerals which are the same as those in FIG. 6 denote the same components. FIG. 7 illustrates an arrangement not comprising a mechanism for driving the lamp connecting metal piece 20 alone in the Z direction as shown in FIG. 6, but the elliptical mirror 28 is driven in the Z direction so as to change the positional relation with the light source lamp 7. Thus, advantages the same as those shown in FIG. 6 can be obtained.

In FIG. 7 portions lower than the partition 21 are the same as those shown in FIG. 6, but above the partition 21 is disposed an X driving mechanism between the elliptical mirror 28 and partition 21. An elliptical mirror fixing post 34 is attached to the elliptical mirror 28, and a Z guide 35 exists between the elliptical mirror fixing post 34 and the elliptical mirror fixing piece 32. Also, a Z driving motor 31 is fixed to the elliptical mirror fixing piece 32, and the ball screw of the Z driving motor 31 is linked to the elliptical mirror fixing post 34. Thus, driving the ball screw with the Z driving motor 31 allows the elliptical mirror 28 to be driven in the Z direction.

Various actions of the semiconductor manufacturing apparatus will be described with reference to FIGS. 1 through 7.

At the time of exposing a semiconductor pattern, the lamp in the lamp box 2 serving as the light source unit thereof is in a constantly lit state. When not performing exposure, a shutter mechanism (not shown) is in a shielding position, so that unnecessary light is not introduced to the exposure projecting lens 5.

Normally, the light source lamp 7 remains in the lit state, and while the lifetime thereof differs according to the usage state of the semiconductor manufacturing apparatus, the light source lamp 7 is replaced once every 75 to 2500 hours of operating. The procedures for replacing the light source lamp 7 will now be described.

The worker replacing the light source lamp 7 first turns off a lamp lighting switch on an operating unit (monitor unit) 15 of the semiconductor manufacturing apparatus. Once the lamp lighting switch of the operating unit 15 is turned off, the electrical power source within the lighting device electrical power source unit 9 is turned off due to signals from the operating unit 15. Subsequently, the worker opens a maintenance hatch (not shown) for exchanging the lamp 7, and exchanges the lamp 7.

Once the worker finishes exchanging the lamp 7, the worker closes the maintenance hatch (not shown), and turns the lamp lighting switch of the operating unit 15 on again, the electrical power source within the lighting device electrical power source unit 9 is turned on, and the light source lamp 7 is lit again.

Next, the action within the lamp box 2 at the time of lighting the light source lamp 7 will be described.

At generally the same time as the electrical power of the lighting device electrical power source unit 9 of the lamp box 2 is turned on, a cooling fan of the cooling device 10 within the lighting device electrical power source unit is activated to turn, thereby initiating cooling. Further, a cooling fan of the lamp cooling device 11 also starts running. Also, once the power of the lighting device electrical power source unit 9 is turned on, electricity is also supplied to the starter unit 8. The starter unit 8 generates high voltage to light the lamp 7, with a charging circuit and a high voltage generating circuit. With the present invention, applying high voltage to the anode side could conceivably result in cases of high voltage necessary for starting discharge being not attached due to effects of atmospheric stray capacitance, so a high voltage is applied to the cathode 7-1 and a low voltage to the anode 7-2.

Generating high voltage at the starter unit 8 starts discharge between the cathode 7-1 and anode 7-2 of the lamp 7. Upon starting of this discharge, noise is generated by the lighting device electrical power source unit 9, starter unit 8, and light source lamp 7. Conventionally, the lamp 7 and starter unit 8, or the starter unit 8 and the lighting device electrical power source unit 9 have been connected with cables, but with the present embodiment, the lighting device electrical power source unit 9, starter unit 8, and light source lamp 7 are integrally configured within the lamp box 2, so there is no noise emitted from cables, meaning that all that is necessary is to suppress the noise from the lighting device electrical power source unit 9, starter unit 8, and light source lamp 7. With the present embodiment, a shielding copper wire mesh 18 is sandwiched between the thermal insulation 17 and 19 covering the lamp box 2 for improving the shielding properties of the lamp box 2, and the copper wire mesh 18 is extended through the lamp box outer walls 16 and is grounded. Accordingly, noise and noise currents generated in the lamp box 2 due to the noise all run to the ground, thereby allowing noise to be contained within the lamp box 2.

Also, with regard to cooling (temperature adjustment), cooling air is sent to the lighting device electrical power source unit 9 by the lighting device electrical power source unit cooling device 10, thereby cooling the lighting device electrical power source unit 9. Generally, the amount of heat generated by the light source lamp 7 is far greater than that generated by the lighting device electrical power source unit 9, so air that has been used for cooling the lighting device electrical power source unit 9 can then be re-used for cooling the lamp 7. This can be realized by integrating the lamp 7 and the lighting device electrical power source unit 9, while conventional separated types require a cooling device 10 and ducts for processing the cooling air for both the light source lamp 7 and the lighting device electrical power source unit 9. Accordingly, integrating the lamp 7 and the lighting device electrical power source unit 9 as with the present embodiment enables the cooling devices 10 and cooling ducts to be reduced in size.

The shape of the connecting metal piece 20, which is the connecting part between the light source lamp 7 and the starter unit 8, is threaded on the inside as shown in FIG. 4, with the same pitch as that of the screw threads of the light source lamp 7. Also, radial wave-like shallow grooves are provided on the face of a contact where the light source lamp 7 comes into contact, so as to increase the area of contact. These wave-like shallow grooves are deformed at the point of contact by tightening the light source lamp 7, so as to ensure that the contact thereof is secure.

Next, a description will be given regarding the driving unit for driving the light source lamp 7 in the X, Y, and Z directions. Conventionally, the connecting metal piece 20 and the starter unit 8 have been separated, so all that was necessary was to drive the connecting metal piece 20 in the X, Y, and Z directions. Conversely, with the present embodiment, the entire lighting device electrical power source unit 9 including the starter unit 8 is driven in the X and Y directions. Even in the case of driving only the connecting metal piece 20 in the X and Y directions as with conventional arrangements, there is still the need to drive in the X direction and Y direction in a precise manner, so objects for restricting the driving direction such as guides or the like, are necessary. These is no difference between the present embodiment and conventional driving mechanisms with regard to the configuration of guides for restricting the driving directions, motors for driving, and so forth, so there are no complications from applying the driving mechanism according to the present embodiment.

First, a description will be given regarding a case of driving the light source lamp 7 in the X direction. In the event of driving the light source lamp 7 in the X direction, the starter unit 8 is driven in the X direction.

In FIG. 5, the X driving motor 27 is operated to drive the starter unit 8 in the X direction, thereby rotating the ball screw of the X driving motor 27. Threads matching the pitch of the ball screw are provided on the part of the starter X driving unit 23 which comes into contact with the ball screw, and rotating the ball screw allows the positional relation of the starter unit 8 and the starter X driving unit 23 to be changed.

In the same way, a description will be made regarding a case of driving the light source lamp 7 in the Y direction. In the event of driving the light source lamp 7 in the Y direction, the starter unit 8 is driven in the Y direction.

In FIG. 5, the Y driving motor 26 is operated to drive the starter unit 8 in the Y direction, thereby rotating the ball screw of the Y driving motor 26. Threads matching the pitch of the ball screw are provided on the part of the starter Y driving unit 25 which comes into contact with the ball screw, and rotating the ball screw allows the positional relation of the starter unit 8 and the starter Y driving unit 25 to be changed. The X driving mechanism and the Y driving mechanism are capable of driving independently in the X and Y directions, with an X guide 22 existing in the X direction and a Y guide 24 in the Y direction, so that driving can be performed with a level of precision equal to that of a conventional arrangement wherein the connecting metal piece 20 is singularly driven.

Next, a description will be made regarding a case of driving the light source lamp 7 in the Z direction.

In the case of driving the light source lamp 7 in the Z direction, performing driving the same as that in the X and Y directions means driving the starter unit 8 in the Z direction, which requires a great driving force, weight-wise. Accordingly, for the Z direction driving mechanism, a driving mechanism is provided within the starter unit 8, configured so as to drive the connecting metal piece fixing part 29 to which the lamp connecting metal piece 20 is fixed, using the Z driving motor. In FIG. 6, in order to drive the light source lamp 7 and the connecting metal piece 20 in the Z direction, the z driving motor 30 is operated, and the ball screw of the Z driving motor 30 is rotated. Threads matching the pitch of the ball screw are provided on the part of the connecting metal piece fixing part 29 which comes into contact with the ball screw, and rotating the ball screw allows the light source lamp 7 and the connecting metal piece 20 to be driven in the Z direction.

Also, a description will be made with regard to an embodiment wherein the light source lamp 7 can be driven in the Z direction without storing such a mechanism in the starter unit 8.

The object of driving the light source lamp 7 in the Z direction is to perform optical correction in the exposure illuminating system, by offsetting the focal point of the elliptical mirror 28 and the center of brightness of the light source. With the present embodiment, changing the position of the elliptical mirror 28 in the Z direction offsets the point of brightness of the light source lamp 7 from the focal point of the elliptical mirror 28, thereby performing optical correction at the exposure illumination system. Note, however, that in this case, the elliptical mirror 28 is moved, so the positional relation of the elliptical mirror 28 and the exposure illumination system is offset, so the elliptical mirror 28 cannot be moved very much. Accordingly, the amount of correction is smaller than that achieved by the Z direction driving means built into the starter unit 8.

In FIG. 7, in the event of driving the elliptical mirror 28 in the Z direction, the Z driving motor 31 fixed to the elliptical mirror fixing piece 32 is driven. When the Z driving motor 31 is driven, the ball screw linked to the elliptical mirror fixing post 34 rotates, the elliptical mirror fixing post 34 moves in the Z direction, and the movement of the elliptical mirror fixing post 34 in the Z direction moves the elliptical mirror 28. In this case, there is a Z guide 35 provided between the elliptical mirror fixing post 34 and the elliptical mirror fixing piece 32, so driving in the Z direction can be performed without any deviation in the X or Y directions at the time of driving.

Embodiment of a Semiconductor Manufacturing System

Next, a description will be made regarding an example of a system for manufacturing semiconductor devices (semiconductor chips such as ICs or LSIs, liquid crystal panels, CCDs, thin-film magnetic heads, micro-machines, etc.) or the like, using the semiconductor manufacturing apparatus described above. This system performs maintenance service such as handling trouble with manufacturing apparatuses installed in a semiconductor manufacturing plant, scheduled maintenance thereof, providing software, and so forth, using an external computer network or the like outside of the manufacturing plant.

Figure 8:
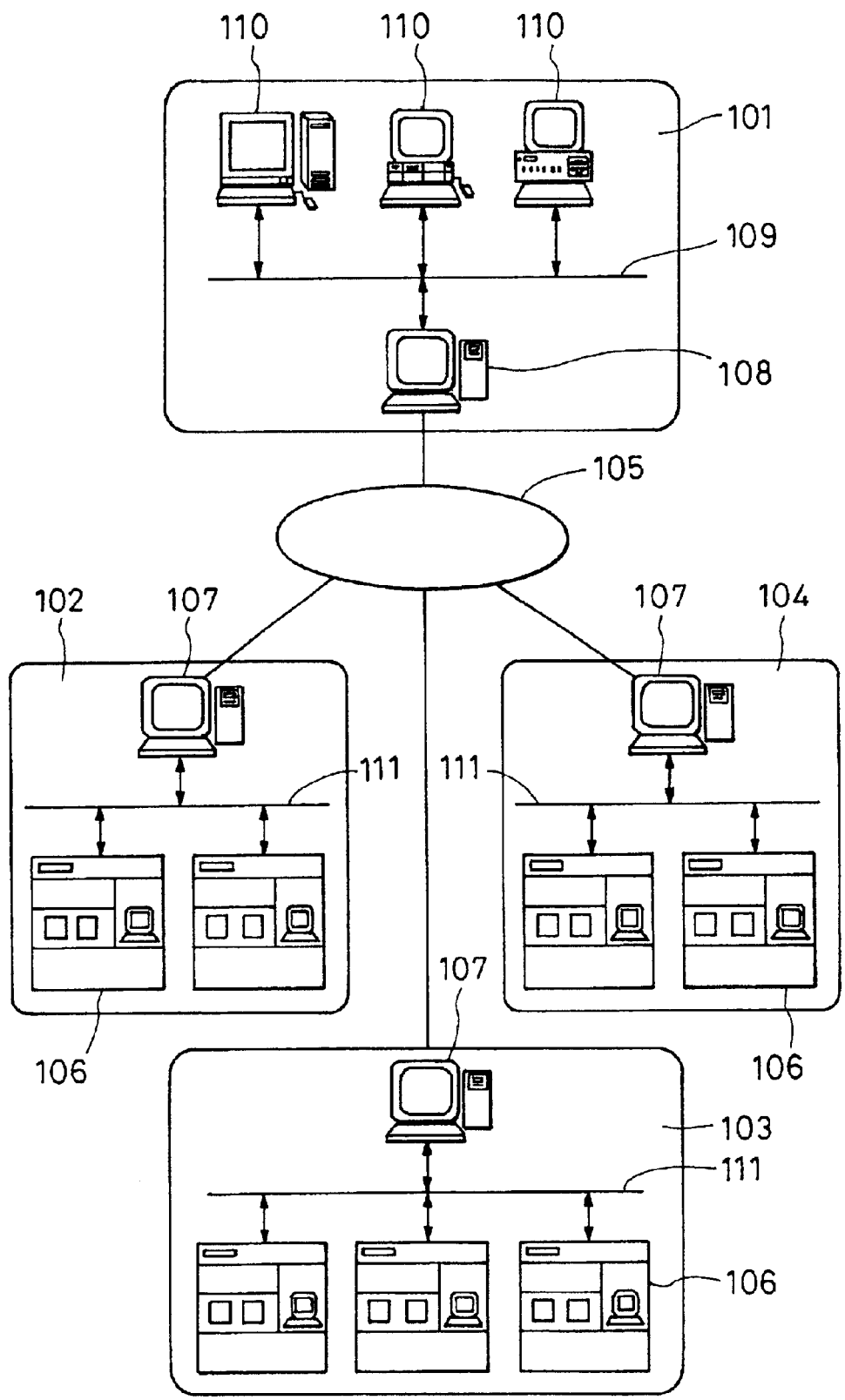
FIG. 8 is a conceptual diagram showing a semiconductor device manufacturing system including the semiconductor manufacturing apparatus according to the first embodiment of the present invention, from one angle.

FIG. 8 represents the overall system cut out at a certain angle. In the figure, reference numeral 101 denotes an office of a vendor which provides semiconductor device manufacturing apparatuses (i.e., an apparatus manufacturer). Actual examples of manufacturing apparatuses include semiconductor manufacturing apparatuses used for various processing in a semiconductor manufacturing plant, such as equipment for fore processing (exposure apparatuses, resist processing apparatuses, etching apparatuses and other like lithography apparatuses, thermal treating apparatuses, film forming apparatuses, smoothing apparatuses, and so forth) and equipment for aft processing (assembly apparatuses, inspection apparatuses, etc.) Within the office 101 are provided a host management system 108 for providing a maintenance database for the manufacturing apparatuses, multiple operating terminal computers 110, and a Local Area Network (LAN) 109 connecting these to configure an intranet or the like. The host management system 108 comprises a gateway for connecting the LAN 109 to the Internet 105 which is an external network outside of the office, and security functions for restricting external access.

On the other hand, reference numerals 102 and 104 denote plants for manufacturing semiconductors (semiconductor device manufacturers) which are users of the manufacturing apparatuses. The manufacturing plants 102 and 104 may be plants belonging to different manufacturers, or may be plants belonging to the same manufacturer (e.g., a fore processing plant and an aft processing plant). Each of the plants 102 and 104 has multiple manufacturing apparatuses 106, a Local Area Network (LAN) 111 connecting these to configure an intranet or the like, and a host managing system 107 serving as a surveillance device for performing surveillance of the operating state of the manufacturing apparatuses 106. The host managing systems 107 provided to the plants 102 and 104 each have gateways for connecting the LANs 111 in the plants to the Internet 105, which is an external network outside of the plants. Thus, the LANs 111 in the plants can access the vendor 101 side host managing system 108 via the Internet 105, and only restricted users can make access due to the security functions of the host managing system 108. Specifically, in addition to the plant side notifying the vendor side of status information indicating the operating state of the manufacturing apparatuses 106 (e.g., symptoms of the manufacturing apparatuses in the event that trouble occurs) via the Internet 105, the plant side can receive from the vendor side response information responding to that notification (e.g., information instructing how to handle the trouble, software or data to use therein, etc.) as well as software updates, help information, and other such maintenance-related information. A communication protocol generally used on the Internet (TCP/IP) is used for data communication between the plants 102 and 104 and the vendor 101, and between the LANs 111 in the plants. Also, a high-security dedicated line network (ISDN or the like) which a third party cannot access, may be used instead of using the Internet for the external network. Also, the host managing system does not need to be provided by the vendor; rather, the user may configure such a database in place of an external network, thereby permitting access to the database from multiple plants of the user.

Figure 9:
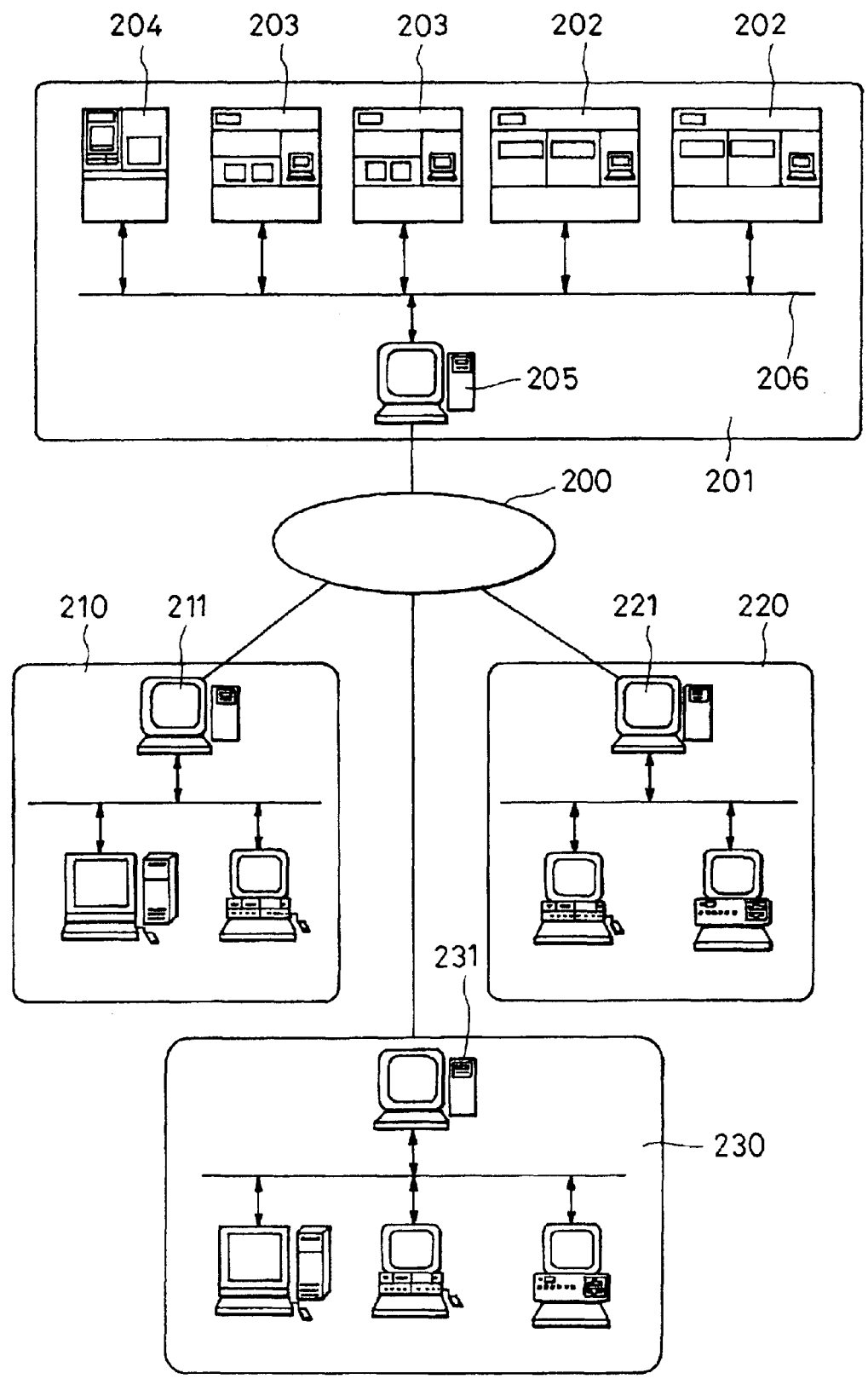
FIG. 9 is a conceptual diagram showing a semiconductor device manufacturing system including the semiconductor manufacturing apparatus according to the first embodiment of the present invention, from another angle.

Now, FIG. 9 is a schematic diagram representing the overall system according to the embodiment cut out at another angle than that shown in FIG. 8. In the example described above, multiple user plants each having manufacturing apparatuses and a managing system of the vendor of the manufacturing apparatuses are connected via an external network, thereby performing production management of the plants and data communication for at least one of the manufacturing apparatuses. Conversely, with the present embodiment, a user plant having multiple manufacturing apparatuses, and managing systems of the vendors for each of the manufacturing apparatuses, are connected via an external network, thereby performing data communication of maintenance information for the manufacturing apparatuses. In the figure, reference numeral 201 denotes a manufacturing plant of a manufacturing apparatus user (semiconductor device manufacturer), with manufacturing apparatuses for each of the various processes installed on the production line in the plant (here, an exposure apparatus 202, a resist processing apparatus 203, and a film formation processing apparatus 204 are installed as an example). While only on manufacturing plant 201 is illustrated here in FIG. 9, in reality multiple plants are networked in the same manner. Intranets or the like are configured by connecting the apparatuses in each plant with LANs 206, and operating management of the production lines is performed by the host managing system 205. On the other hand, the offices of vendors (apparatus manufacturers), e.g., the exposure apparatus manufacturer 210, resist processing apparatus manufacturer 220, and film formation apparatus manufacturer 230, have host managing systems 211, 221, and 231, respectively, for performing remote maintenance of the equipment which they have supplied, and each of the host managing systems has maintenance databases and gateways to the external network, as described above. The host managing system 205 for managing the apparatuses within the manufacturing plants of the user and the host managing systems 211, 221, and 231 of the vendors are connected by the Internet or a dedicated line network serving as an external network 200. With this system, in the event that there is trouble with any of the manufacturing apparatuses on the production line, the production line is shut down, but this shutdown of the production line can be kept to a minimum by speedy measures taken through remote maintenance via the network 200 by the vendor of the apparatus which is having trouble.

Each of the manufacturing apparatuses installed in the semiconductor manufacturing plant comprises a display, a network interface, software stored in a storage device for accessing the network, and a computer for executing software for operating the apparatus. Examples of the storage device include internal memory, hard disks, or network file servers or the like. The aforementioned network access software includes a dedicated or general-purpose Web browser, and provides on a display a user interface with a screen such as shown in the example in FIG. 10, for example. An operator managing the manufacturing apparatuses in the plants makes reference to the screen, and inputs information such as the model of the manufacturing apparatus 401, serial number of the manufacturing apparatus 402, title of the trouble 403, date of occurrence 404, urgency 405, symptoms 406, measures 407, results 408, and so forth, as input items on the screen. The input information is transmitted to the maintenance database via the Internet, and corresponding appropriate maintenance information is returned from the maintenance database and is displayed on the display. Also, the user interface which the Web browser provides, further realizes hyperlink functions 410, 411, and 412, as shown in the drawing, so the operator can access further detailed information for each items, get updated versions of software used with the manufacturing apparatuses from software libraries provided by the vendors, and get operating guides (help information) to be referred to by plant operators. Now, the maintenance information provided by the maintenance database also contains information relating to the present invention as described above, and the software libraries also provide updated software for realizing the present invention.

Figure 11:
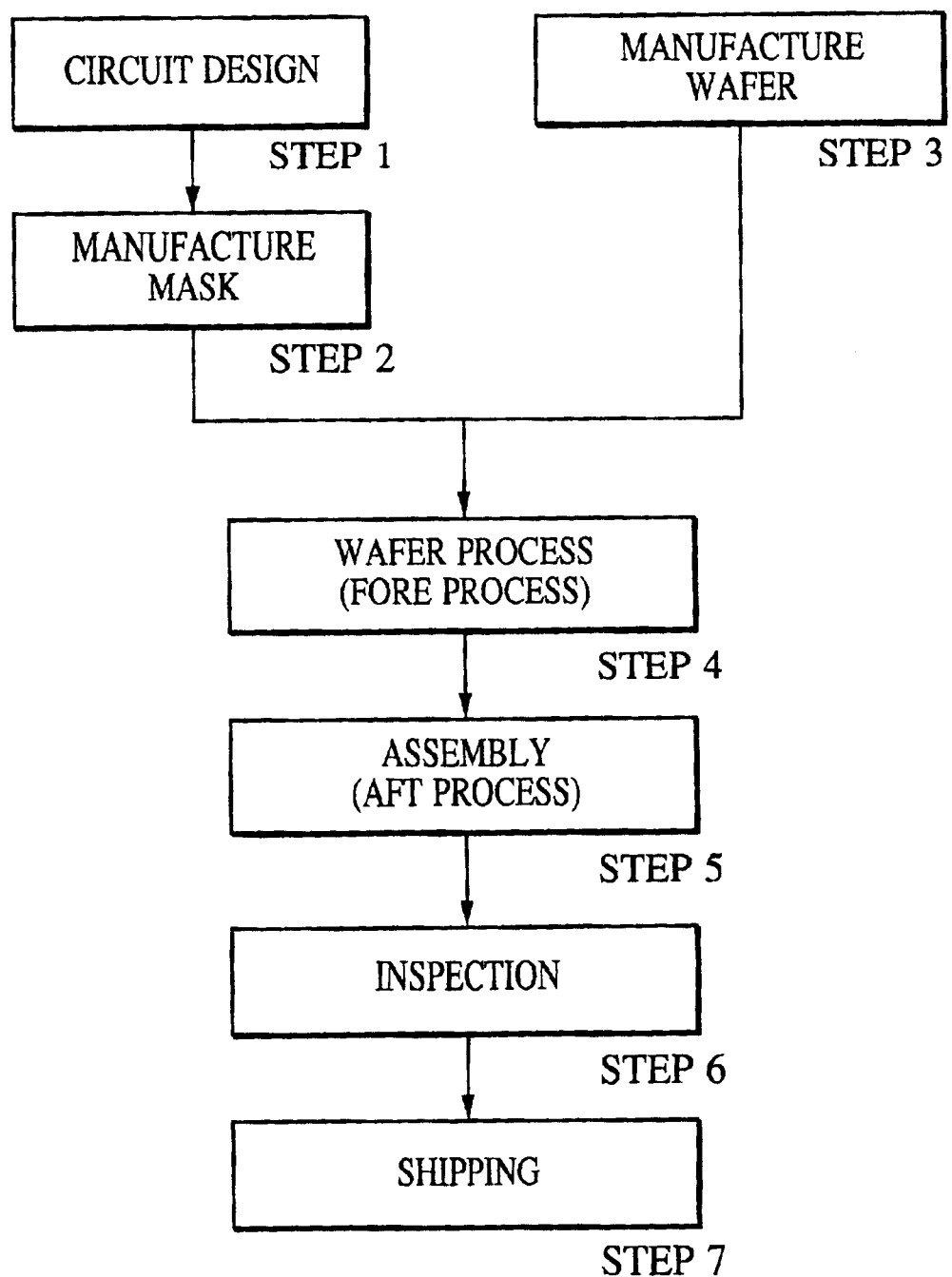
FIG. 11 is a diagram illustrating the flow of a device manufacturing process using the semiconductor manufacturing apparatus according to the first embodiment of the present invention.

Next, a description will be made regarding the process for manufacturing semiconductor devices using the manufacturing system described above. FIG. 11 illustrates the flow of the overall semiconductor device manufacturing process. In step 1 (circuit design), the circuit of the semiconductor device is designed. In step 2 (manufacture mask), a mask is fabricated in the form of the designed circuit pattern. In step 3 (manufacture wafer), a wafer is manufactured using material such as silicon. Step 4 (wafer process) is also referred to as a fore process, wherein actual circuits are formed on the wafer using lithography, with the mask and wafer prepared in the previous steps. The next step 5 (assembly) is also referred to as an aft process, which is a process for forming semiconductor chips using the wafer formed in step S4, and this also includes the assembly process (dicing and bonding) and the packaging process (sealing the chip) and so forth. In step 6 (inspection), tests for checking the operation, durability, etc., of the semiconductor device manufactured in step 5, are performed. The semiconductor device is thus completed by the above processes, and is then shipped (step 7). The fore and aft processes are each performed in separate dedicated plants, and each of the plants is maintained by the above-described remote maintenance systems. Also, information for production management or apparatus maintenance or the like is communicated via the Internet or dedicated line network between the fore and aft process plants, as well.

Figure 12:
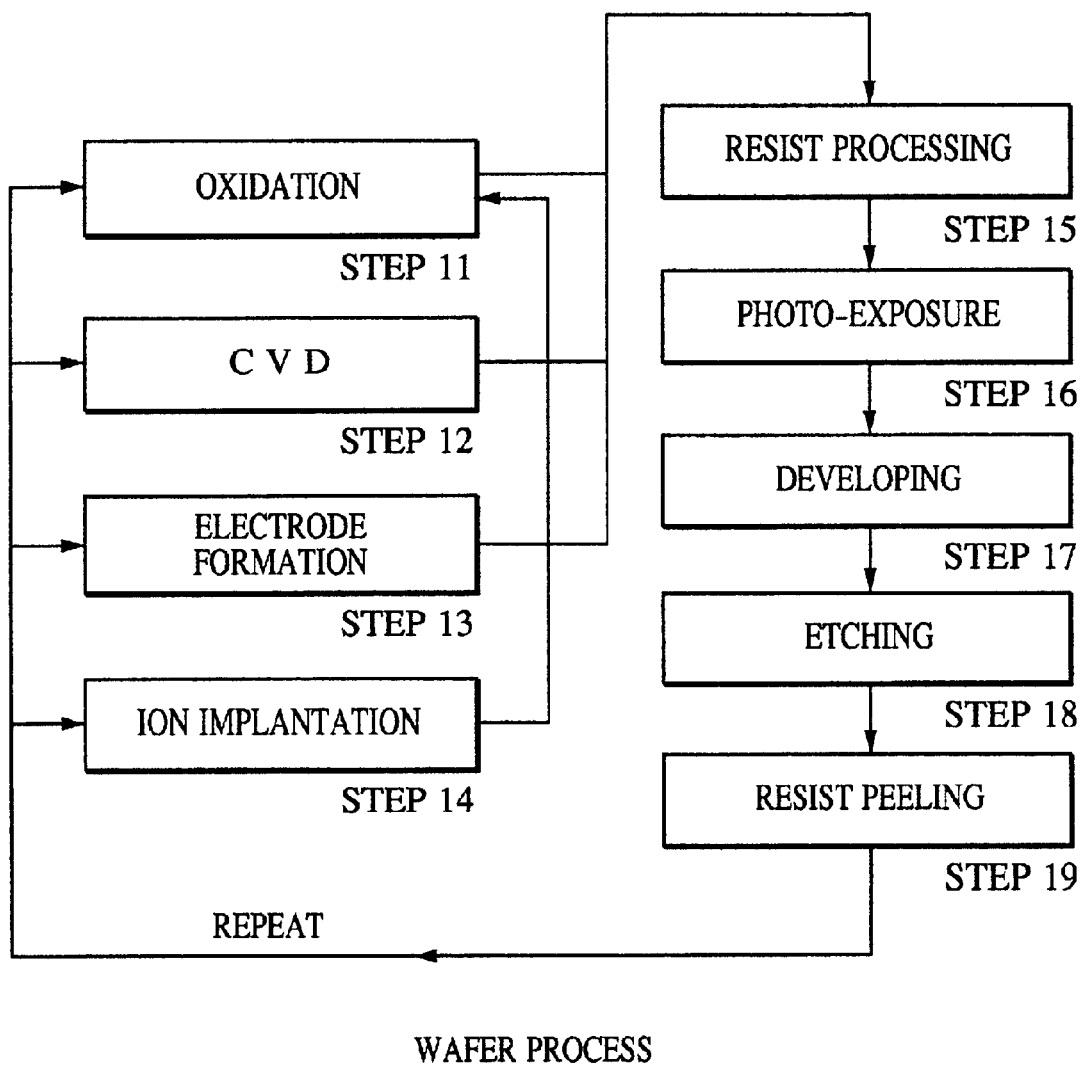
FIG. 12 is a diagram illustrating a wafer process using the semiconductor manufacturing apparatus according to the first embodiment of the present invention.

FIG. 12 illustrates a detailed flow for the above-described wafer process. In step 11 (oxidation), the surface of the wafer is oxidized. In step 12 (CVD), an insulating film is formed on the surface of the wafer. In step 13 (electrode formation), electrodes are formed on the wafer by vapor deposition. In step 14 (ion implantation), ions are implanted in the wafer. In step 15 (resist processing), a photosensitive agent is applied to the wafer. In step 16 (exposure), the circuit pattern of the mask is imaged onto the wafer using the above-described semiconductor manufacturing apparatus (exposure device and so forth). In step 17 (developing), the exposed wafer is developed. In step 18 (etching), parts other than the developed resist image are etched away. In step 19 (resist peeling), the resist, which has become unnecessary due to etching being completed, is removed. Repeating these steps forms a multi-layer circuit pattern on the wafer. The manufacturing apparatuses used in each process are maintained by the above-described remote maintenance system, so that trouble can be prevented beforehand, and even in the event that trouble does occur, speedy recovery can be made, so the productivity of the semiconductor devices can be improved as compared to conventional arrangements.

Except as otherwise discussed herein, the various components shown in outline or block form in the figures are individually well known and there internal construction and operation are not critical to the making or using or to a description of the best mode of the invention.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor manufacturing apparatus comprising:
    a light source; and
    a lighting device, said lighting device comprising:
    (i) an electrical power source unit for supplying electricity to said light source, and
    (ii) a starter unit for lighting said light source,
    wherein a first unit coupled to the lighting device moves the lighting device in a first direction and a second unit coupled to the lighting device moves the lighting device in a second direction, and
    wherein said starter unit includes a metal piece for connecting said lighting device to said light source, and a third unit for moving the metal piece and the connected light source relative to the connected lighting device in a third direction.

2. A semiconductor manufacturing apparatus according to claim 1, wherein said light source is a discharge lamp.

3. A semiconductor manufacturing apparatus according to claim 1, wherein said metal piece is disposed at a side wherein high voltage is applied for lighting said light source.

4. A semiconductor manufacturing apparatus according to claim 1, further comprising a mechanism for integrally driving said light source and said lighting device.

5. A semiconductor manufacturing apparatus according to claim 1, further comprising means for changing the positional relation between said light source and an optical element disposed near said light source.

6. A semiconductor manufacturing apparatus according to claim 1, wherein said light source and said lighting device are disposed within a single housing.

7. A semiconductor manufacturing apparatus according to claim 6, wherein said housing has outer walls provided with electromagnetic shielding and has a configuration of copper wire mesh sandwiched between thermal insulating material, said copper wire mesh being grounded.

8. A semiconductor manufacturing apparatus according to claim 6, wherein the temperature of said light source and said lighting device is adjusted using air of the ambient atmosphere from outside said housing, taken into said housing from a single air intake and being subjected to temperature adjustment with a single temperature adjusting means.

9. A semiconductor manufacturing apparatus according to claim 8, wherein said light source and said lighting device are subjected to temperature adjustment in the order of said lighting device first and then said light source, using the taken in air.

10. A semiconductor manufacturing apparatus comprising:
    a light source;
    a lighting device for lighting said light source;
    a connector for connecting said light source and said lighting device with a metal piece;
    a first unit coupled to the lighting device for moving the lighting device in a first direction;
    a second unit coupled to the lighting device for moving the lighting device in a second direction; and
    a third unit in the lighting device for moving the metal piece and the connected light source relative to the connected lighting device in a third direction.

11. A semiconductor manufacturing apparatus according to claim 10, wherein said light source is a discharge lamp.

12. A semiconductor manufacturing apparatus according to claim 10, wherein said light source and said lighting device are disposed within a single housing.

13. A semiconductor manufacturing apparatus according to claim 12, wherein said housing has outer walls provided with electromagnetic shielding and has a configuration of copper wire mesh sandwiched between thermal insulating material, said copper wire mesh being grounded.

14. A semiconductor manufacturing apparatus according to claim 10, wherein said metal piece is disposed at a side wherein high voltage is applied for lighting said light source.

15. A semiconductor manufacturing apparatus according to claim 10, further comprising a mechanism for integrally driving said light source and said lighting device.

16. A semiconductor manufacturing apparatus according to claim 10, further comprising means for changing the positional relation between said light source and an optical element disposed near said light source.

17. A semiconductor manufacturing apparatus according to claim 12, wherein the temperature of said' light source and said lighting device is adjusted using air of the ambient atmosphere outside said housing, taken into said housing from a single air intake and being subjected to temperature adjustment with a single temperature adjusting means.

18. A semiconductor manufacturing apparatus according to claim 17, wherein said light source and said lighting device are subjected to temperature adjustment in the order of said lighting device first and then said light source, using the taken in air.

19. A semiconductor manufacturing apparatus in which a computer having a display, a network interface, and networking software-provides data communication of maintenance information through a computer network, said semiconductor manufacturing apparatus comprising a lamp box including:
   a light source;
   a lighting device for lighting said light source; and
   a connector for connecting said light source and said lighting device with a metal piece;
   a first unit coupled to the lighting device for moving the lighting device in a first direction;
   a second unit coupled to the lighting device for moving the lighting device in a second direction; and
   a third unit in the lighting device for moving the metal piece and the connected light source relative to the connected lighting device in a third direction.

20. A semiconductor manufacturing apparatus according to claim 19, wherein said networking software provides, on said display, a user interface for accessing a maintenance database which is provided by a vendor or user of said semiconductor manufacturing apparatus and which is connected to an external network outside of a plant wherein said semiconductor manufacturing apparatus is installed, thereby enabling information to be obtained from said database via said external network.

21. A semiconductor device manufacturing method comprising the following steps:
   a step of installing, in a semiconductor manufacturing plant, a set of manufacturing apparatuses for performing various processes, including the semiconductor manufacturing apparatus according to claim 10; and
   a step of manufacturing semiconductor devices by a plurality of processes using the set of manufacturing apparatuses.

22. A semiconductor device manufacturing method according to claim 21, further comprising the following steps:
   a step of connecting the set of manufacturing apparatuses by a Local Area Network; and
   a step of performing data communication of information relating to at least one apparatus of the set of manufacturing apparatuses, between the Local Area Network and the external network outside of the semiconductor manufacturing plant.

23. A semiconductor device manufacturing method according to claim 22, further comprising accessing a database, which is provided by a vendor or user of the semiconductor manufacturing apparatus, via the external network and obtaining maintenance information for the manufacturing apparatus by data communication, or performing data communication with a semiconductor manufacturing plant other than the semiconductor manufacturing plant, via the external network, so as to manage production.

24. A semiconductor manufacturing plant, comprising:
   a set of manufacturing apparatuses for performing various processes, the set including the semiconductor manufacturing apparatus according to claim 10;
   a Local Area Network connecting said set of manufacturing apparatuses; and
   a gateway enabling access to an external network outside of said plant from said Local Area Networks,
   wherein data communication of information relating to at least one apparatus of said set of manufacturing apparatuses is performed.

25. A maintenance method for the semiconductor manufacturing apparatus according to claim 10 installed in a semiconductor manufacturing plant, said method comprising the following steps:
   a step of a vendor or user of the semiconductor manufacturing apparatus providing a maintenance database connected to an external network outside of the semiconductor manufacturing plant;
   a step of permitting access to the maintenance database from within semiconductor manufacturing plant via the external network; and
   a step of transmitting maintenance information accumulated in the maintenance database to the semiconductor manufacturing plant side via the external network.

* * * * *

UNITED STATES PATENT AND TRADEMARK OFFICE
CERTIFICATE OF CORRECTION

PATENT NO. : 6,810,299 B2
DATED : October 26, 2004
INVENTOR(S) : Gen Nakamura

It is certified that error appears in the above-identified patent and that said Letters Patent is hereby corrected as shown below:

<u>Title page,</u>
Item [57], ABSTRACT,
Line 2, the first occurrence of "light" should read -- light of --
Line 3, "source" should read -- source. --. (first occurrence)

<u>Column 6,</u>
Line 36, "In the" should read -- In --.

<u>Column 9,</u>
Line 67, "z driving" should read -- Z driving --.

<u>Column 10,</u>
Line 62, "etc.)" should read -- etc.). --

<u>Column 11,</u>
Line 63, "only on" should read -- only one --.

<u>Column 12,</u>
Line 45, "items." should read -- item, --.

<u>Column 13,</u>
Line 38, "there" should read -- their --.

<u>Column 14,</u>
Line 31, "taken in" should read -- taken-in --.
Line 67, "said'" should read -- said --.

<u>Column 15,</u>
Line 9, "taken in" should read -- taken-in --.
Line 12, "software-provides" should read -- software provides --.

UNITED STATES PATENT AND TRADEMARK OFFICE
CERTIFICATE OF CORRECTION

PATENT NO. : 6,810,299 B2
DATED : October 26, 2004
INVENTOR(S) : Gen Nakamura

It is certified that error appears in the above-identified patent and that said Letters Patent is hereby corrected as shown below:

Column 16,
Line 26, "Networks," should read -- Network, --.
Line 39, "semiconductor" should read -- the semiconductor --.

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,810,299 B2
DATED : October 26, 2004
INVENTOR(S) : Gen Nakamura

It is certified that error appears in the above-identified patent and that said Letters Patent is hereby corrected as shown below:

<u>Title page,</u>
Item [57], ABSTRACT,
Line 2, the first occurrence of "light" should read -- light of --
Line 3, "source" should read -- source. --. (first occurrence)

<u>Column 6,</u>
Line 36, "In the" should read -- In --.

<u>Column 7,</u>
Line 54, "75 to" should read -- 750 to --.

<u>Column 9,</u>
Line 67, "z driving" should read -- Z driving --.

<u>Column 10,</u>
Line 62, "etc.)" should read -- etc.). --

<u>Column 11,</u>
Line 63, "only on" should read -- only one --.

<u>Column 12,</u>
Line 45, "items." should read -- item, --.

<u>Column 13,</u>
Line 38, "there" should read -- their --.

<u>Column 14,</u>
Line 31, "taken in" should read -- taken-in --.
Line 67, "said'" should read -- said --.

<u>Column 15,</u>
Line 9, "taken in" should read -- taken-in --.
Line 12, "software-provides" should read -- software provides --.

UNITED STATES PATENT AND TRADEMARK OFFICE
CERTIFICATE OF CORRECTION

PATENT NO.    : 6,810,299 B2
DATED         : October 26, 2004
INVENTOR(S)   : Gen Nakamura It is certified that error appears in the above-identified patent and that said Letters Patent is hereby corrected as shown below:

<u>Column 16,</u>
Line 26, "Networks," should read -- Network, --.
Line 39, "semiconductor" should read -- the semiconductor --.

This certificate supersedes Certificate of Correction issued April 19, 2005.

Signed and Sealed this

Seventeenth Day of May, 2005

JON W. DUDAS
*Director of the United States Patent and Trademark Office*